US006831372B2

United States Patent
Ruhland

(12) United States Patent
(10) Patent No.: US 6,831,372 B2
(45) Date of Patent: Dec. 14, 2004

(54) ELECTRONIC DEVICES WITH SEMICONDUCTOR CHIPS AND A LEADFRAME WITH DEVICE POSITIONS AND METHODS FOR PRODUCING THE SAME

(75) Inventor: Christian Ruhland, Schwarzenfeld (DE)

(73) Assignee: Infineon Technologies AG, Munich (DE)

( * ) Notice: Subject to any disclaimer, the term of this patent is extended or adjusted under 35 U.S.C. 154(b) by 11 days.

(21) Appl. No.: 10/260,902

(22) Filed: Sep. 30, 2002

(65) Prior Publication Data

US 2003/0075792 A1 Apr. 24, 2003

(30) Foreign Application Priority Data

Sep. 28, 2001 (DE) .......................................... 101 48 120

(51) Int. Cl.[7] .......................... H01L 23/48; H01L 23/52
(52) U.S. Cl. ...................... 257/783; 257/787; 257/666; 257/693
(58) Field of Search ................................ 257/783, 787, 257/666, 693

(56) References Cited

U.S. PATENT DOCUMENTS

| 5,021,865 | A | * | 6/1991 | Takahashi et al. .......... 257/666 |
| 5,262,674 | A | | 11/1993 | Banerji et al. |
| 5,756,380 | A | | 5/1998 | Berg et al. |
| 5,909,054 | A | * | 6/1999 | Kozono ........................ 257/667 |
| 5,973,337 | A | * | 10/1999 | Knapp et al. ................ 257/790 |
| 6,034,422 | A | | 3/2000 | Horita et al. |
| 6,229,200 | B1 | | 5/2001 | Mclellan et al. |
| 6,392,294 | B1 | * | 5/2002 | Yamaguchi .................. 257/690 |
| 6,396,135 | B1 | * | 5/2002 | Narvaez et al. ............. 257/678 |
| 6,433,277 | B1 | * | 8/2002 | Glenn ......................... 174/52.4 |
| 6,462,418 | B2 | * | 10/2002 | Sakamoto et al. .......... 257/753 |
| 6,469,393 | B2 | * | 10/2002 | Oya ............................ 257/779 |
| 6,479,901 | B1 | * | 11/2002 | Yamada ....................... 257/774 |
| 6,538,313 | B1 | * | 3/2003 | Smith ........................... 257/684 |
| 6,538,319 | B2 | * | 3/2003 | Terui ............................ 257/704 |
| 6,593,643 | B1 | * | 7/2003 | Seki et al. ................... 257/677 |
| 6,617,695 | B1 | * | 9/2003 | Kasatani ...................... 257/777 |
| 6,627,981 | B2 | * | 9/2003 | Shibata ........................ 257/678 |

FOREIGN PATENT DOCUMENTS

| JP | 1-106455 | * | 4/1989 | .................. 257/793 |
| JP | 1-297828 | * | 11/1989 | .................. 257/783 |

* cited by examiner

Primary Examiner—Jasmine Clark
(74) Attorney, Agent, or Firm—Laurence A. Greenberg; Werner H. Stemer; Ralph E. Locher

(57) ABSTRACT

Electronic devices with a semiconductor chip and leadframes with device positions and methods for producing the same are encompassed by the invention. The electronic devices include a semiconductor chip disposed with its rear side on a chip island. The chip island has a coplanar pattern of electrically conductive contact layer regions alternating with insulating adhesion layer regions, which is covered by the semiconductor chip.

35 Claims, 8 Drawing Sheets

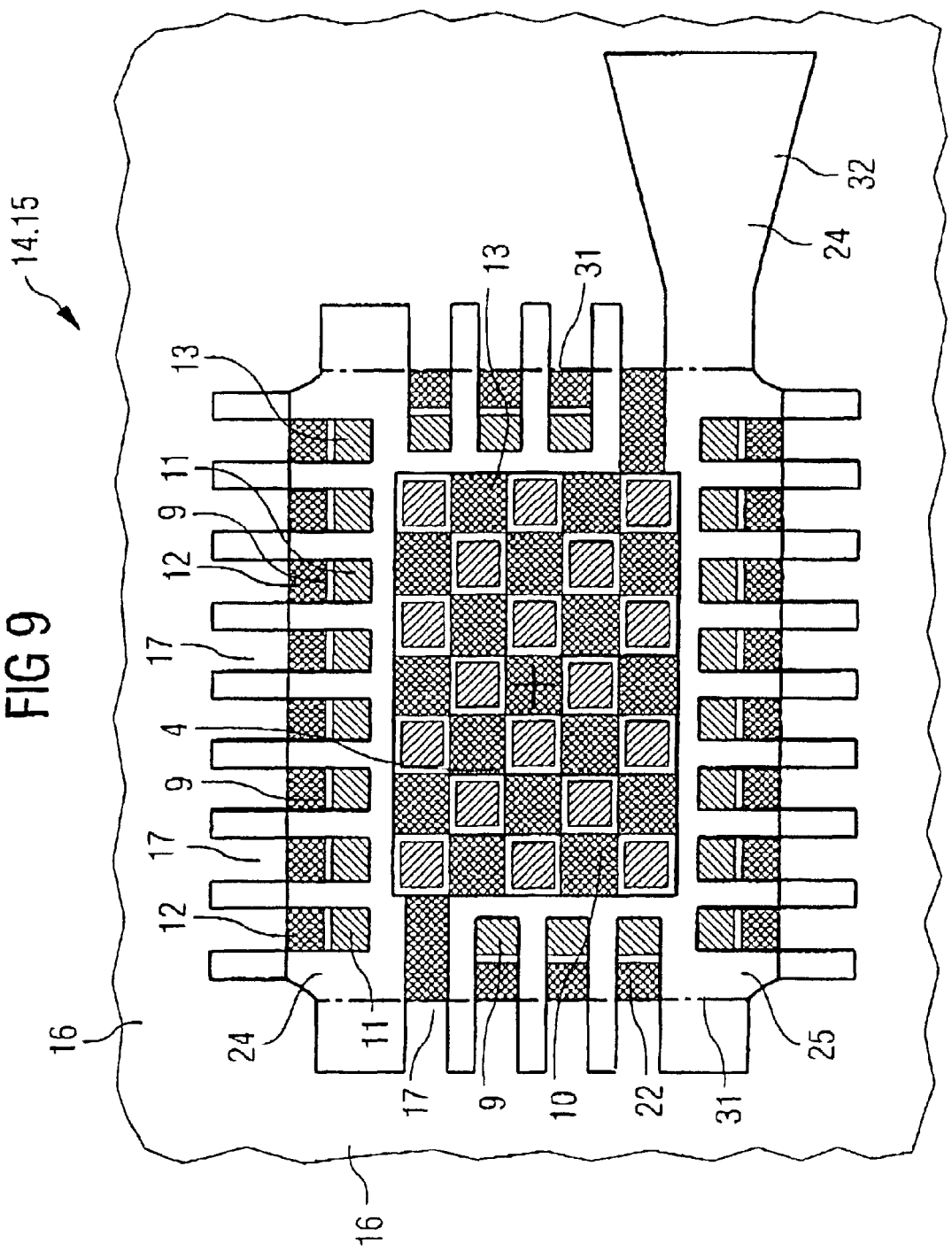

ELECTRONIC DEVICES WITH SEMICONDUCTOR CHIPS AND A LEADFRAME WITH DEVICE POSITIONS AND METHODS FOR PRODUCING THE SAME

BACKGROUND OF THE INVENTION

Field of the Invention

The invention relates to electronic devices with semiconductor chips and a leadframe with device positions and to methods for producing the same.

Semiconductor chips with contact areas on their active top sides, which have integrated circuits, are disposed on chip islands of leadframes and their contact areas are connected to contact pads or bonding fingers on corresponding inner flat conductor sections of the leadframe via connecting lines. The inner flat conductor sections with their contact pads serve to create a transition from the microscopically small contact areas of a semiconductor chip to macroscopic output terminals of the electronic device. In this connection, "microscopically small" is to be understood as dimensions in the micrometer range that can be measured with the aid of a light microscope. By contrast, "macroscopic structures" can already be discerned and measured with the naked eye.

The chip island serves to receive a semiconductor chip of predetermined size and to connect the rear side of the semiconductor chip to the potential of the chip island via an electrically conductive adhesive layer. However, in production, after functional testing, failures occur in which the potential of the chip island is not present at the rear side of the semiconductor chip.

SUMMARY OF THE INVENTION

It is accordingly an object of the invention to provide electronic devices with semiconductor chips and a leadframe with device positions and methods for producing the same that overcome the hereinafore-mentioned disadvantages of the heretofore-known devices and methods of this general type and that reduce failures creates a reliable electrical connection for the rear side of the semiconductor chip, and enables semiconductor chips of different size to be mounted and reliably contact-connected on a chip island of unchanged size.

With the foregoing and other objects in view, there is provided, in accordance with the invention, an electronic device and a lead-frame, having a semiconductor chip, which is disposed with its rear side on a chip island. On its top side, the semiconductor chip has contact areas electrically connected to contact pads of the chip island or to contact pads of inner flat conductor sections. The chip island has a coplanar pattern of electrically conductive contact layer regions alternating with insulating adhesion layer regions at least in the region of the chip island that is covered by the semiconductor chip.

Such a coating below the adhesive layer of the semiconductor chip and directly on the metallic surface of the chip island has reduces the failures during the testing of the finished electronic devices. This novel intermediate layer includes a coplanar pattern of electrically conductive contact layer regions and insulating adhesion layer regions below the adhesive layer with which the semiconductor chip is fixed on the metallic surface of the chip island. The intermediate layer has been able to successfully reduce the migration of filling material of the conductive adhesive layer into the copper surface of the leadframe and at the same time improve the adhesion of the adhesive layer by the insulating adhesion layer regions.

Consequently, it has been possible to eliminate the cause—determined after intensive investigations—of the migration of a conductive filling material to the copper surface and an associated depletion of filling material in the conductive adhesive. Although the insulating adhesion layer regions on the chip island reduce the contact layer of the conductive adhesive, the increase in the contact resistance in these adhesion layer regions has been able to be compensated for by the improved contact of the conductive adhesive in the contact layer regions.

Both the contact layer regions and the adhesion layer regions of the coplanar pattern on the chip island successfully prevent the migration of the electrically conductive filling material of the conductive adhesive in the direction of the metal surface of the chip island. Furthermore, the adhesion layer regions on the chip island provide for an intensive anchoring of the conductive adhesive and thus for an intensive anchoring of the semiconductor chip on the chip island. The combined application of contact layer regions and adhesion layer regions as coplanar pattern on the chip island thus ensures that the rear side of the semi-conductor chip is reliably connected to the electrical potential of the chip island.

In one embodiment of the invention, the pattern has a chessboard pattern. Such a chessboard pattern has the advantage that the semiconductor chip on the chip island can be miniaturized as desired and can be shrunk in its size, without immediately having to construct a new housing and a new substrate carrier with an adapted chip island, since a surface-size-independent anchoring of the electrically conductive adhesive is ensured by the chessboard-like adhesion layer regions and, on the other hand, a sufficient size-independent contact-making and connection between rear side of the semi-conductor chip and chip island is likewise ensured by the chessboard-like contact layer regions.

Instead of the chessboard pattern, the coplanar pattern on the chip island may also have a strip pattern. A strip pattern is also associated with the advantage that the size of the chip can be miniaturized as desired, without reducing the chip island size.

Instead of the strip pattern or the chessboard pattern, further embodiments of the invention provide rhomboid patterns or annular patterns, which have a similar advantage to chessboard patterns and strip patterns.

In a further embodiment of the invention, the contact layer regions have an electrodeposited metal alloy plating. This electrodeposited metal alloy plating is not covered by the insulating adhesion layer at the contact layer regions, so that the contact layer regions of the coplanar pattern are electrically connected to the conductive adhesive for the semiconductor chip on the chip island. Such an electro-deposited plating has the advantage that it can be applied in a large-area manner both on the chip island and on inner flat conductor sections and can subsequently be structured by a selective covering in the adhesion layer regions to form the pattern according to the invention.

In a further embodiment of the invention, the metal alloy plating has aluminum, silver, gold, or alloys thereof. These metals are accumulated by the contact layer regions in such a concentrated manner on the metallic top side of the chip island that a depletion of conductive solid material formed from metal particles in the adhesive cannot take place. In addition, the metallic filling material for the conductive adhesive can be coordinated with the contact layer material. Thus, it is advantageous, in the case of a silver particle filling of the adhesive, for the contact layer regions likewise to be produced from an electro-deposited silver layer in order thus to prevent the migration of silver to the metallic surface of the chip island, which may be composed of copper or copper alloy.

On account of the selectively provided adhesion layer, the surface of the electrodeposited metal alloy plating remains freely accessible for a connection to connecting lines, i.e. the metal alloy plating is kept free of the adhesion layer both below the semiconductor chip and on inner flat conductor sections, in order to ensure both a connection of the contact layer regions to bonding wire lines and a connection of the rear side of the semiconductor chip to the potential of the chip island. Although the adhesion layer includes materials that hinder an electrical connection, contact layer regions are also provided below the semiconductor chip on the inner flat conductors and on the chip island, which contact layer regions are refined with a connect-able coating and ensure an electrical contact-connection.

In a further embodiment of the invention, the adhesion layer has a metal oxide layer. Such metal oxide layers are electrically nonconductive and would thus form an insulating interruption on the contact layer regions of the chip island if they are not positioned selectively but rather on the entire area of the leadframe. Therefore, the further description also discusses the possibilities of how such a metal oxide layer can be selectively applied in a cost-effective manner.

A further embodiment of the invention provides for the adhesion layer to have a zinc/chromium mixed oxide with 50–90 mol % zinc and 10–50 mol % chromium. Such a zinc/chromium mixed oxide ensures an anchoring of the inner flat conductor sections, which have an adhesion layer region, in a plastic housing and an anchoring of the semiconductor chip with its conductive adhesive on the chip island.

In a further embodiment of the invention, the adhesion layer is electrodeposited on the inner flat conductor sections and on selectively defined regions of the chip island. In this case, metal oxide dendrites grow from the surface of a metal and form a rough surface as adhesion layer region, so that the adhesive layer is anchored on the rear side of the semiconductor chip in a positively locking manner with the top side of the chip island in the selectively determined regions of the coplanar pattern. Consequently, the risk of loosening, wobbling, or shifting of the semiconductor chip, in particular during the process of packaging into a plastic housing, which represents a high loading for the conductive adhesive layer, is reduced on account of the intensive positively locking anchoring on the chip island.

The material of the adhesion layer is advantageously alkali-resistant but acid-soluble, while the material of the leadframe and the material of the metal alloy plating of the contact layer regions are acid-resistant. This coordination of the material properties of adhesion layer regions and leadframe and contact layer regions makes it possible, in a relatively simple manner, to comply with and not exceed the phase boundary between adhesion layer and contact layer regions for the uncovering of the contact pads during the structuring of an adhesion layer applied in a closed manner.

The leadframe has a pure copper, a copper alloy, or a copper-coated plastic tape in a further embodiment of the invention. This copper material is resistant to acids. Furthermore, the contact layer regions may have a silver alloy or a silver solder alloy. This material improves an electrical connection of the contact layer regions on the chip island to the conductive adhesive on the rear side of the semiconductor chip.

In order to produce such electronic devices, use is made of leadframes with device positions which form a leadframe tape when strung together or a leadframe plate when configured in a matrix. In one embodiment of the invention, such leadframe tapes or leadframe plates are a preliminary product for the production of electronic devices and can be produced and sold cost-effectively as a preliminary product by specialized manufacturers.

In a further embodiment of the invention, such a preliminary product has a frame for each device position. Holding webs are provided on each frame, which holding webs on the one hand extend from the frame in the direction of a chip island that receives the semiconductor chip, and on the other hand extend from the leadframe frame directly to inner flat conductor sections. The inner flat conductor sections are the sections that are disposed toward the semi-conductor chip and are later encapsulated by plastic housing compound.

The inner flat conductor sections form self-supporting ends. On the self-supporting ends, contact layer regions are disposed directly adjacent to the central region for the semi-conductor chip. For anchoring with the plastic housing, the inner flat conductor sections have adhesion layer regions in addition to the contact layer regions. The contact layer regions disposed on the self-supporting ends of the inner flat conductor sections are surrounded by the adhesion layer regions and the surfaces of the contact layer regions remaining free of such an adhesion layer.

The chip island in each device position of the lead-frame has a coplanar pattern of alternating regions. These alternating regions are, on the one hand, adhesion layer regions and, on the other hand, contact layer regions. The contact layer regions are free of any adhesion layer and have a noble metal plating made of aluminum, silver, gold, or alloys thereof. In this case, the adhesion layer regions provide for a reliable anchoring of the conductive adhesive and hinder the migration of the conductive filler of the adhesive in the direction of the surface of the chip island. At the same time, the contact layer regions provide for ensuring a reliable electrical contact-connection by the noble metal plating on the copper of the chip island. A preferred coplanar pattern of adhesion layer regions and contact layer regions on the chip island is a chess-board pattern. This embodiment of the invention has the advantage that semiconductor chips of different size can be disposed on chip islands that are structured in an unchanged manner. In this case, contact layer regions remain free in that edge region of the chip island that is not covered by the semiconductor chip. The contact layer regions can make the chip potential available at contact areas on the top side of the semiconductor chip via bonding wire connections.

In addition to the chessboard pattern, in further embodiments of the invention, it is also possible to employ rhomboid patterns, annular patterns and strip patterns, which have similar advantages to a chessboard pattern.

Leadframes structured and constructed in this way with corresponding device positions, as a preliminary product for the production of electronic devices, may already be equipped with selectively disposed adhesion layer regions and contact layer regions by suppliers. In order to position a leadframe prepared in this way in a placement machine, the leadframes have a perforation along their edge regions. With this perforation, they can be taken stepwise or continuously through the automatic placement machine, the automatic placement machine having a plurality of production positions for the stepwise production of electronic devices.

As a result of equipping the leadframe with an adhesion layer already disposed selectively both on the chip island and on the inner flat conductors, the leadframe can pass through all of the steps, including the encapsulation in a plastic housing to form an electronic device in the automatic placement machine. Consequently, there is no need to provide an electro-deposition step for forming an adhesion-improving layer after complete placement of the leadframe between placement position and housing encapsulation position. This yields an additional time saving during the completion of electronic devices, since it is possible to dispense with an intermediate adhesion-improving electrodeposition step prior to the encapsulation when using the leadframe according to the invention. As a result, the leadframe according to the invention also simultaneously eliminates the risk of damage to semi-conductor chips and bonding wires by an electrodeposition process of an adhesion promoters.

Specifically, when coating a semiconductor chip with an electrodeposited material, there is the risk that the passivation layer situated on the semiconductor chip will take up ions from the electrodeposition bath and thus impair the properties of the integrated circuit. This impairment can lead to the complete failure of the electronic device. Moreover, in the electrodeposition bath, as a result of deposition of metal oxides on the metallic connecting lines between contact areas of the semiconductor chip and contact layer regions of the leadframe, the connecting lines can become brittle and break in the course of subsequent packaging in a plastics compound, so that there is the risk of high rejects. In the case of the production of electronic devices using the leadframe according to the invention with adhesion layer regions and contact layer regions disposed selectively in a coplanar pattern at least on the chip island, it is possible, therefore, to reckon on fewer rejects and thus increase the productivity.

With the objects of the invention in view, there is also provided a method for producing a leadframe for electronic devices includes the following method steps. A first step is structuring a raw tape or a raw plate, which has at least one metal surface, to form a leadframe with a perforation and structures configured in a matrix or successively for each device position with a chip island and outer and inner flat conductor sections. The next step is coating the chip island and the inner flat conductor sections with material for contact layer regions. The next step is selectively applying an adhesion layer in adhesion layer regions of the chip island and the inner flat conductor sections of the leadframe structure in the device positions whilst leaving free the contact layer regions in the form of a coplanar pattern.

In the case of this method, the entire surface of the chip island may be provided with a closed contact layer and the entire surface of the inner flat conductor sections may be provided with the contact layer. After that, either a closed adhesion layer may be deposited onto the contact layer made of a material such as aluminum, silver, gold, or alloys thereof and the closed adhesion layer may subsequently be removed selectively in such a way that contact layer regions are uncovered on the chip island and on the inner flat conductor sections, or the adhesion layer regions are applied selectively by a selective method in which only the regions provided as adhesion layer regions are coated with an adhesion layer.

On the other hand, it is also possible for the contact layer regions already to be applied selectively by using a mask or a stencil and, given suitable structuring with the same mask and stencil, for the adhesion layer regions to be produced selectively merely by displacement of the stencil. To that end, a coplanar pattern having a chessboard pattern, a rhomboid pattern, or a strip pattern can advantageously be used. By contrast, this possibility of simple shifting of the mask or stencil does not exist in the case of an annular pattern. In the case of an annular pattern it is necessary to provide two different stencils for the creation of contact layer regions and adhesion layer regions on a chip island.

In a further exemplary implementation of the invention, a screen-printing method or a stencil printing method may be provided for a selective coating of the chip island and the inner flat conductor sections with material for the contact layer regions and/or the adhesion layer regions. These methods have the advantage that they require a low outlay in terms of production engineering and, consequently, can be carried out cost-effectively.

Vapor deposition technology is a method that permits a large-area closed coating in the device positions of a leadframe. Consequently, in a further exemplary implementation of the method, firstly the chip island and the inner flat conductor sections are coated with material for contact layer regions by using vapor deposition technology and only the adhesion layer regions are applied selectively to the contact layer material. The selective application of the adhesion layer region may again be performed by screen-printing methods or stencil printing methods. Instead of vapor deposition technology, it is also possible to use a sintering technology in which a paste including metal particles and binding particles is applied in the device positions of the leadframe and then, in a heat treatment process, the metal powder is sintered together to form a coating and the binder is evaporated.

In a further exemplary implementation, it is provided that the chip island and the inner flat conductor sections are applied one after the other first with material for the contact layer regions in the form of a continuous coating electrically by using electro-plating and subsequently a closed layer for the material of the adhesion layer regions is applied to the leadframe structures by using electrodeposition. Afterward, only the adhesion layer is then structured to form the pattern provided.

In this exemplary implementation of the method, still further method steps are required after the application of the adhesion layer for the structuring or for the selective application. Firstly, the closed nonstructured adhesion layer is covered with a closed photolithography layer. Afterward, the photolithography layer is subjected to heat treatment for the purpose of crosslinking the photoresist. Afterward, the photolithography layer and the adhesion layer in the pattern provided on the chip island and on the inner flat conductor sections are selectively removed for the purpose of uncovering the contact layer regions disposed beneath.

This method variant has the advantage that the photolithography layer and the underlying adhesion layer, which both cover the entire inner flat conductor sections and the chip island, can be removed selectively in the region of the contact layer regions and can thus uncover the contact layer regions with their metal alloy plating. Afterward, connecting lines can be provided without difficulty on the contact layer regions and a reliable contact-connection with the conductive adhesive can be ensured in the region of the chip island. In this case, the crosslinked photoresist layer serves merely for protecting the adhesion layer regions that are not to be removed on the chip island and on the inner flat conductor sections in the vicinity of the contact layer regions. Furthermore, the photolithography layer forms an organic medium that, on the one hand, can be applied cost-effectively in a closed manner and, on the other hand, can be removed selectively at the corresponding locations, so that at least the adhesion layer on the contact layer regions to be uncovered is freed of photoresist. The closed adhesion layer on the contact layer regions to be uncovered can be removed either at the same time as the selective removal of the photolithography layer or subsequently by an additional step, in order to uncover the surface of the metal alloy plating of the contact layer regions.

In the case of an electroplating of the contact layer regions and/or the adhesion layer regions, in preparation for such an electroplating, the regions that are not to be coated can be covered beforehand, which can likewise be carried out by using a photo-lithographic layer or a layer applied by screen printing. Material can be saved as a result of these coverings before the electrodeposition.

During the electrodeposition, the leadframe is drawn through an electrolytic bath essentially containing sodium hydroxide solution, zinc oxide, or sodium dichromate, from which chromium, zinc, and oxygen ions are deposited dendritically on the leadframe connected to the cathode potential. The dendritic deposition of the adhesion layer or the adhesion layer regions results in a positively locking anchoring of the conductive adhesive for the semiconductor chip on the chip island and a form locking anchoring of the plastics compound of the housing with the inner flat conductors and thus produces a mechanically very stable connection between the adhesive and the chip island or the plastic housing composition and the inner flat conductor sections. A form-locking connection is one that connects two elements together due to the shape of the elements themselves, as opposed to a force-locking connection, which locks the elements together by force external to the elements.

The dendritic growth during the electrodeposition of the adhesion layer results in a rough surface for the adhesion layer, which improves the anchoring. A further advantage of the method is that a covering of the adhesion layer with a closed photolithography layer is provided, without the latter being structured by exposure or development steps but rather being suitably crosslinked by a heat treatment step and subsequently being structured by laser ablation or laser removal. With the aid of laser ablation, it is possible to avoid the expensive methods for structuring photolithography layers with the aid of exposure and development methods and correspondingly cost-intensive installations. The following method steps are carried out during the selective removal of the adhesion layer and also of the photolithography layer with the aid of laser ablation. The first step is vaporizing the photolithography layer by using a scanned laser beam in the region of the contact layer regions to be uncovered. The next step is melting-down of the adhesion layer in the region of the contact layer regions to be uncovered by using the scanned laser beam. The next step is etching-away of the residual melted-down adhesion layer.

This method has the advantage that it uses a sharply delimited laser beam and selectively vaporizes the crosslinked photoresist by scanning the laser beam over the contact pads and, on account of the point energy of the beam, levels and melts down the dendrite structure of the adhesion layer at least in a region of the adhesion layer near the surface.

Such a laser beam has the property of vaporizing a crater from a material such as a photolithography layer, so that a crater landscape is produced on the bottom of the crater. However, by virtue of the melting-on of the dendritic adhesion layer, this landscape is leveled and a relatively constant adhesion layer thickness is achieved on the bottom of the photo-lithography layer in the laser-scanned region. The residual melted-on thin adhesion layer can then be removed by an etching step, the intact photolithography layer protecting the remaining region of the surface of the chip and the inner flat conductors.

The particular material combination between the material of the metal alloy plating and the material of the adhesion layer is shown to advantage during such an etching step. While the adhesion layer material of the invention made of metal oxides is acid-soluble, both the photolithography layer made of a photoresist and the metal alloy plating situated below the adhesion layer are chosen to be relatively acid-resistant according to the invention. Consequently, during a wet-chemical etching, the residual melted-on adhesion layer residue can be etched away by using an acid as far as a boundary layer with respect to the metal alloy plating of the contact layer regions.

In a further exemplary implementation of the method for producing a leadframe, the etching-away of the residual melted-on adhesion layer can be effected by using a plasma etching method. During this dry etching method, under a potential difference, reactive ions are directed at the adhesion layer under acceleration, the material of the adhesion layer essentially being sputtered. The dry-chemical method is significantly more complicated than a wet-chemical method in terms of the installation concept, but has the advantage that it can be carried out more precisely and in a manner that is less harmful to the environment.

In order to remove the residual photolithography layer from the residual adhesion layer after the selective etching of the adhesion layer, the leadframe can be dipped into an alkaline solution. Because the photoresist is not resistant to alkaline solution, it is dissolved in such a solution. What is produced as a result of this method step is a leadframe with inner flat conductor sections and a chip island that has a coplanar pattern of contact layer regions alternating with adhesion layer regions.

Instead of alkaline stripping of the photolithography layer, the residual photolithography layer can also be incinerated by plasma vaporization. However, after incineration, a rinsing step is additionally required to remove solid contaminations produced during the incineration from the surface of the leadframe or the surface of the adhesion layer regions and the contact layer regions.

In principle, the photolithography layer can be removed selectively by exposure, fixing and wet-chemical development. However, such a method requires masks, exposure installations, and the use of solvents under explosion-protected installations, it being necessary to comply with multiple hazardous material regulations. In this case, in particular during the development and stripping of the photoresist at the selectively exposed locations, it is necessary to resort to chemicals that are coordinated with the photoresist used and the actual coating process, namely the adhesion layer material. By contrast, the method according to the invention with laser ablation of the photoresist has the advantage that the photoresist can be removed by using the laser partially and selectively without any wet-chemical installation and without precautionary measures. Consequently, the laser vaporization replaces both the exposure and the development and the selective stripping of the photoresist. The only condition that has to be met by the crosslinked photoresist is that it can be vaporized or burned away by the laser.

In order to produce an electronic device, further method steps are required in addition to the preparation of a leadframe in the form of a leadframe plate or a leadframe tape. Thus, a semiconductor chip is applied on the chip island of the leadframe after the end of the steps for producing a coplanar pattern of adhesion layer regions and contact layer regions on the chip island. This application of the semiconductor chip can be effected by using adhesive bonding technology, by a suitable adhesive, such as a conductive adhesive, being applied on the central region of the chip island and the semiconductor chip subsequently being pressed onto the adhesive layer. In this case, the height differences between the deeper contact layer regions and the higher adhesion layer regions are overcome, thereby producing both a good mechanical anchoring through the pressing-on of the adhesive, and an intensive electrical contact-connection on the contact layer regions of the chip island.

For connection of the contact areas of the semiconductor chip to the contact layer regions both of the edge region of the chip island and the contact layer regions on the inner flat conductor sections, it is possible to employ the bonding technology using bonding wires. In this case, a bonding wire made of aluminum can be bonded both on the chip island area that is refined with a metal alloy plating and on the corresponding areas of the inner flat conductors.

In various further exemplary implementations of the method according to the invention, it is possible to employ thermocompression bonding, which has the advantage that firstly a molten bead of the bonding wire is formed without touching the contact areas of the semi-conductor chip or the contact layer regions on the edge region of the chip island or the contact layer regions of the inner flat conductors at one end of the bonding wire and then the molten bead is pressed onto the contact area or onto the contact layer regions. A further alternative to thermocompression bonding is ultrasonic bonding, in which ultrasonic energy is used to achieve a friction welding on the contact layer regions or on the contact areas.

As a further alternative for connecting the contact areas of the semiconductor chip to contact layer regions of the leadframe and the chip island, it is possible to employ thermosonic bonding, which represents a combination of ultrasonic bonding and thermo-compression bonding. Finally, it likewise appears to be possible to achieve the connection of the contact areas to the contact layer regions by soldering technology. In this case, corresponding solder reservoirs are deposited on the contact layer regions of the inner flat conductor sections and/or on the contact area regions of the chip island. The soldering can then be realized by using a relatively low solder melting point for example by application of flip-chip technology.

To summarize, it must be emphasized that the invention has the advantage that an adhesion layer structure independent of the semiconductor chip size is provided in the form of a coplanar pattern of contact layer regions and adhesion layer regions at least on the chip island below the semiconductor chip. The adhesion properties of the adhesion layer regions yield excellent results in improving the boundary layer between the leadframe and the adhesive layer for the applied semiconductor chip. The disadvantage that the adhesion-improving adhesion layer does not enable an electrically conductive connection is overcome by the invention's pattern of adhesion layer regions and contact layer regions on the chip island. Moreover, these differently coated regions produce a chip island that can receive semiconductor chips in a size-independent manner as long as the semiconductor chip does not go beyond the chip island size.

The otherwise required outlay of introducing an adhesion layer after the bonding and after the fixing of the semiconductor chip on the chip island on the entire leadframe assembly in the individual device positions, in order to improve the adhesion of the plastic housing composition on the individual components of the electronic device, can be overcome by using the structured coplanar pattern of contact layer regions and adhesion layer regions both on the chip island and on the surfaces of the inner flat conductors. To summarize, the following advantages result: a pattern of contact layer regions and adhesion layer regions for different sizes of semi-conductor chips with the simultaneous possibility of accommodating bonding wires in the edge region of the chip island for ground connection; bondability of the contact layer regions for example made of silver or a silver alloy is ensured by the adhesion layer regions that are defined and selectively delimited in the pattern; and a migration of the filling metal in the conductive adhesive such as silver to the metal surface of the leadframe in particular of the chip island is completely prevented by the closed pattern of contact layer regions and adhesion layer regions.

Other features that are considered as characteristic for the invention are set forth in the appended claims.

Although the invention is illustrated and described herein as embodied in electronic devices with semiconductor chips and a leadframe with device positions and methods for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 9 is a plan view showing a device position of a leadframe according to a seventh embodiment of the invention.

DESCRIPTION OF THE PREFERRED EMBODIMENTS

Figure 1:
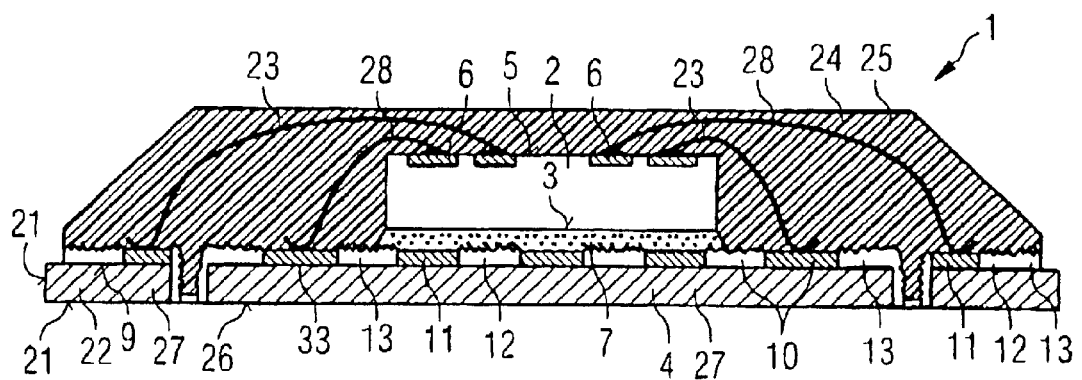
FIG. 1 is a diagrammatic cross-sectional view of an electronic device according to a first embodiment of the invention.

Referring now to the figures of the drawings in detail and first, particularly to FIG. 1 thereof, there is shown a diagrammatic cross-sectional view of an electronic device 1 of a first embodiment of the invention. The reference symbol 2 identifies a semiconductor chip, which has a rear side 3 and is disposed with the rear side 3 on a chip island 4. The reference symbol 5 identifies the top side of the semiconductor chip 2, on which an integrated circuit is disposed and which has contact areas 6. In addition to the chip island 4, in the edge regions of the electronic device 1, flat conductors 22 are partly embedded in a plastics molding compound 24. The reference symbol 10 identifies a coplanar pattern of contact layer regions 11 and adhesion layer regions 12 on the top side of the chip island 4 and on the top side of the inner flat conductor sections. The semiconductor chip 2 is applied to this pattern with a conductive adhesive layer 7. In this case, the adhesive layer 7 is anchored mechanically in the dendritically grown adhesion layer made of a zinc/chromium mixed oxide, which has 50–90 mol % zinc and 10–50 mol % chromium and simultaneously prevents the filling metal of the adhesive from migrating to the metallic top side of the chip island 4. The contact-making with the potential of the chip island 4 is ensured by the contact layer regions 11 of the coplanar pattern 10. The reference symbol 9 identifies inner flat conductor sections of the flat conductors 22, which are likewise covered by a pattern of contact layer regions and adhesion layer regions. The outer flat conductor sections 21 lie outwardly opposite the inner flat conductor sections. The outer flat conductor sections 21 and the underside of the chip island 4 form external contacts 27 on the underside 26 of the electronic device 1.

Such an electronic device is also known as a device with SONLP housing (Small Outline Non-Leaded Package). In the case of this type of housing, the outer flat conductor sections 21 form the external contacts 27, which can be accessed from the underside of the housing and from the edge sides of the housing. The particular feature of this housing is that the copper surface of the chip island does not come into contact with the conductive adhesive layer 7 and its filling material made of metal powder, thereby preventing a migration of the metal particles in the conductive adhesive. Furthermore, in the case of this device, the size of the semiconductor chip 2 can be miniaturized, without having to alter the size of the chip island 4 and thus the structure of the leadframe. Finally, what is achieved in the case of this device of the first embodiment of the invention is that the adhesive layer 7 is anchored in a positively locking manner with the adhesion layer regions 12.

Figure 2:
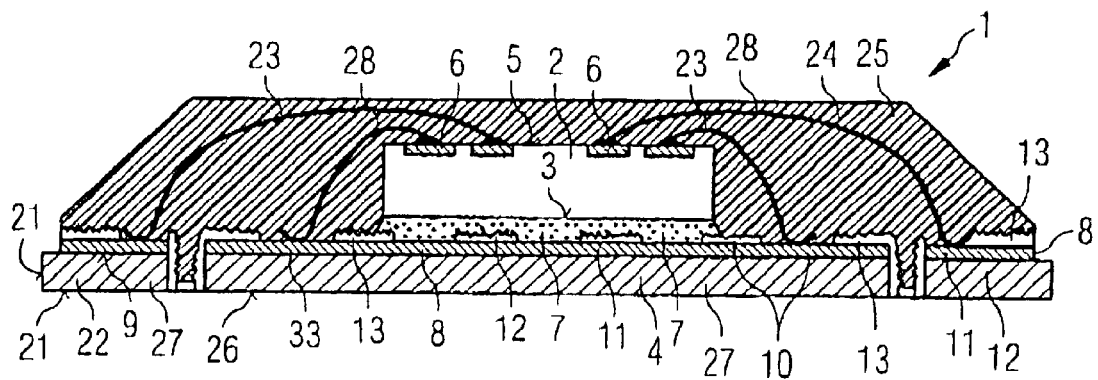
FIG. 2 is a cross-sectional view showing an electronic device according to a second embodiment of the invention.

FIG. 2 shows a diagrammatic cross-sectional view of an electronic device 1 of a second embodiment of the invention. Components with functions identical to those in FIG. 1 are identified by identical reference symbols and not explained separately.

The way in which the second embodiment according to FIG. 2 differs from the first embodiment according to FIG. 1 is that a closed metal layer 8 made of a noble metal is applied on the entire chip island and adhesion layer regions 12 are disposed selectively on this metal layer 8, so that contact layer regions 11 and adhesion layer regions 12 alternate on the top side of the chip island 4. However, both have a height difference, because the contact layer regions 11 are located deeper relative to the adhesion layer regions 12. This height difference is compensated for by the electrically conductive adhesive layer 7, which anchors the semiconductor chip 2 on the chip island 4 and electrically connects it to the chip island 4.

Figure 3:
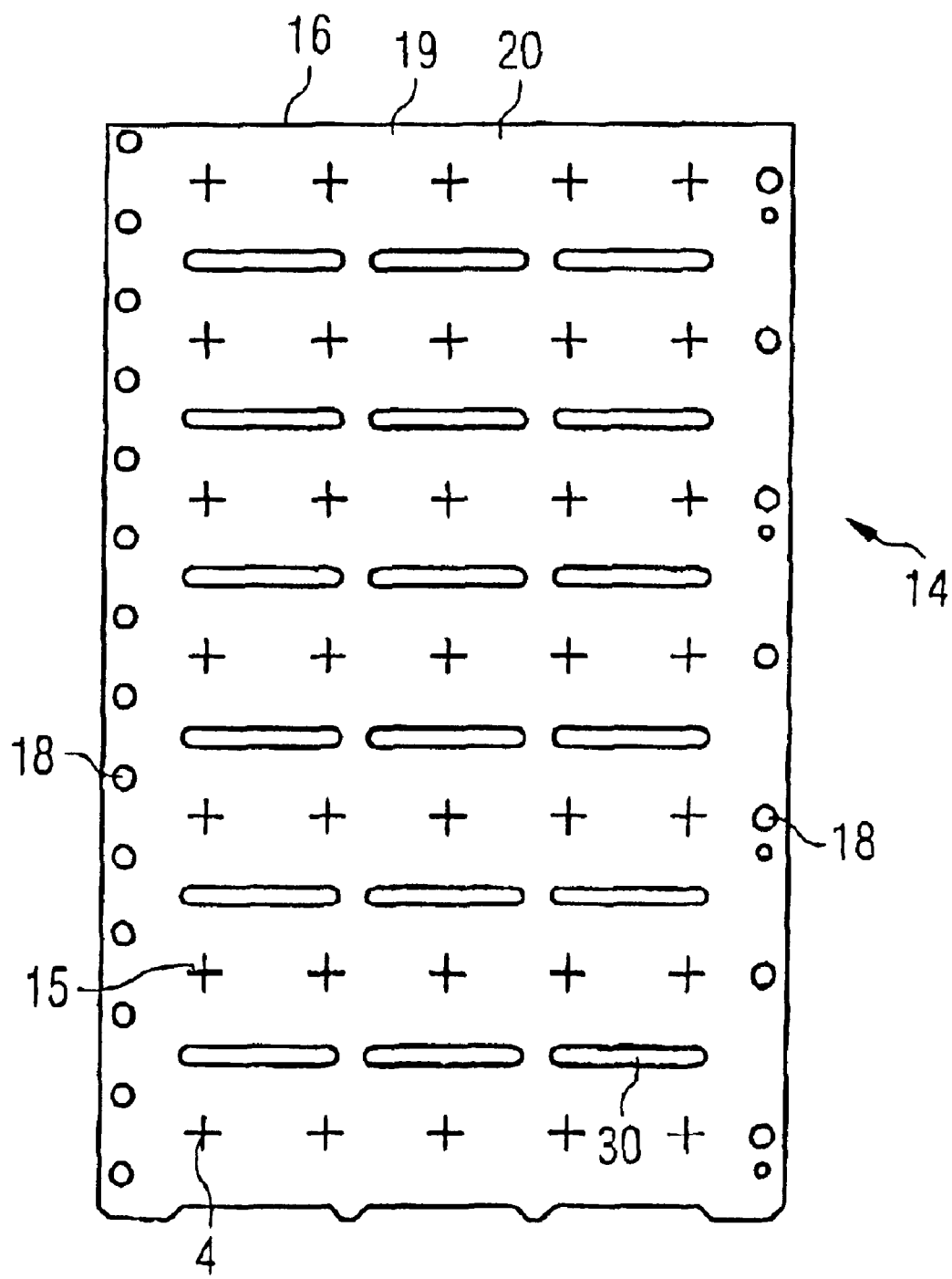
FIG. 3 is a plan view showing a lead-frame with device positions in a matrix configuration.

FIG. 3 shows a diagrammatic plan view of a leadframe 14 with device positions 15 in a matrix configuration. Components with functions identical to those in the previous figures are identified by identical reference symbols and not explained separately.

In this case, the leadframe 14 is configured as a leadframe tape with perforations 18 in the edge region of the leadframe 14. Furthermore, the leadframe 14 has five columns in the longitudinal direction and as many rows as desired transversely with respect thereto. Via the elongated holes 30 in the leadframe 14, the plastics molding compound 24 can be distributed between the gate funnels 32 of each individual device position 15. In this exemplary embodiment, the leadframe 14 has copper or a copper alloy, which are supplied as a raw plate 20 or raw tape 19.

The leadframe 14 shown in FIG. 3 is produced from a raw tape 19. This raw tape 19 has ultrapure copper or a copper alloy and is firstly structured by the stamping of successive device positions 15. At the same time, a perforation 18 is introduced at the edges of the leadframe 14. This perforation 18 serves for transporting the leadframe tape through an automatic placement and bonding machine.

Figure 4:
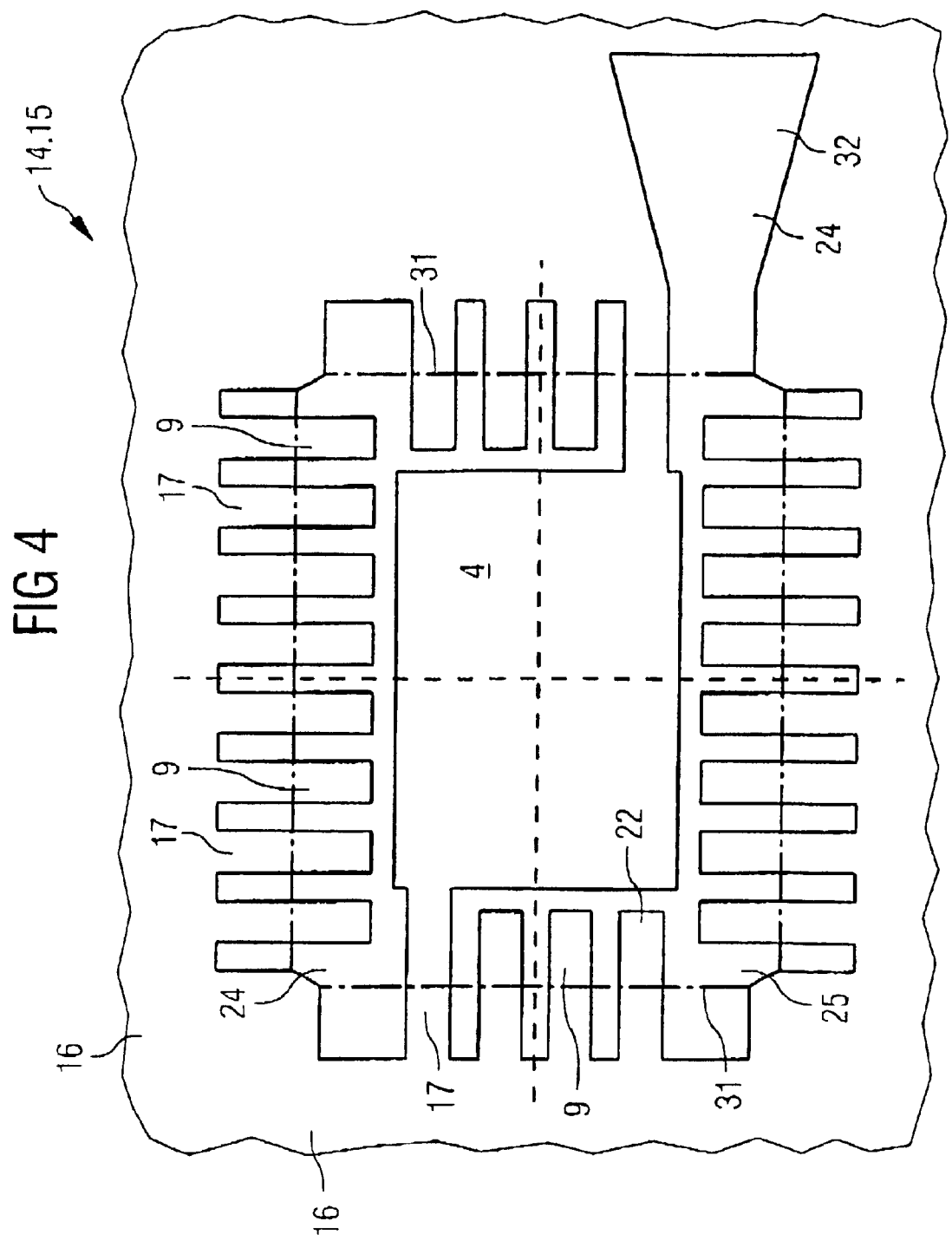
FIG. 4 is a plan view showing an uncoated device position of a leadframe.

FIG. 4 shows a diagrammatic plan view of an uncoated device position 15 of a leadframe 14. Components with functions identical to those in the previous figures are identified by identical reference symbols and not explained separately.

Such a device position 15 is disposed between the elongated holes 30 of FIG. 3 and has a structure that can receive a semiconductor chip 2 on a chip island 4. The chip island 4 is held in position by a leadframe frame 16 by holding webs 17. The chip island 4 is surrounded, at a distance, by inner flat conductor sections 9, the inner flat conductor sections 9 merging, toward the leadframe frame 16, with webs 17 which connect the leadframe frame 16 to the inner flat conductor sections 9. The dash-dotted line identifies the boundary of the plastic housing 25, which is formed by encapsulating the components with a plastics compound 24 during packaging. The plastics compound 24 is supplied via the elongated holes 30, which can be seen in FIG. 3, and the gate funnels 32 in each device position 15 with plastics molding compound 24.

Figure 5:
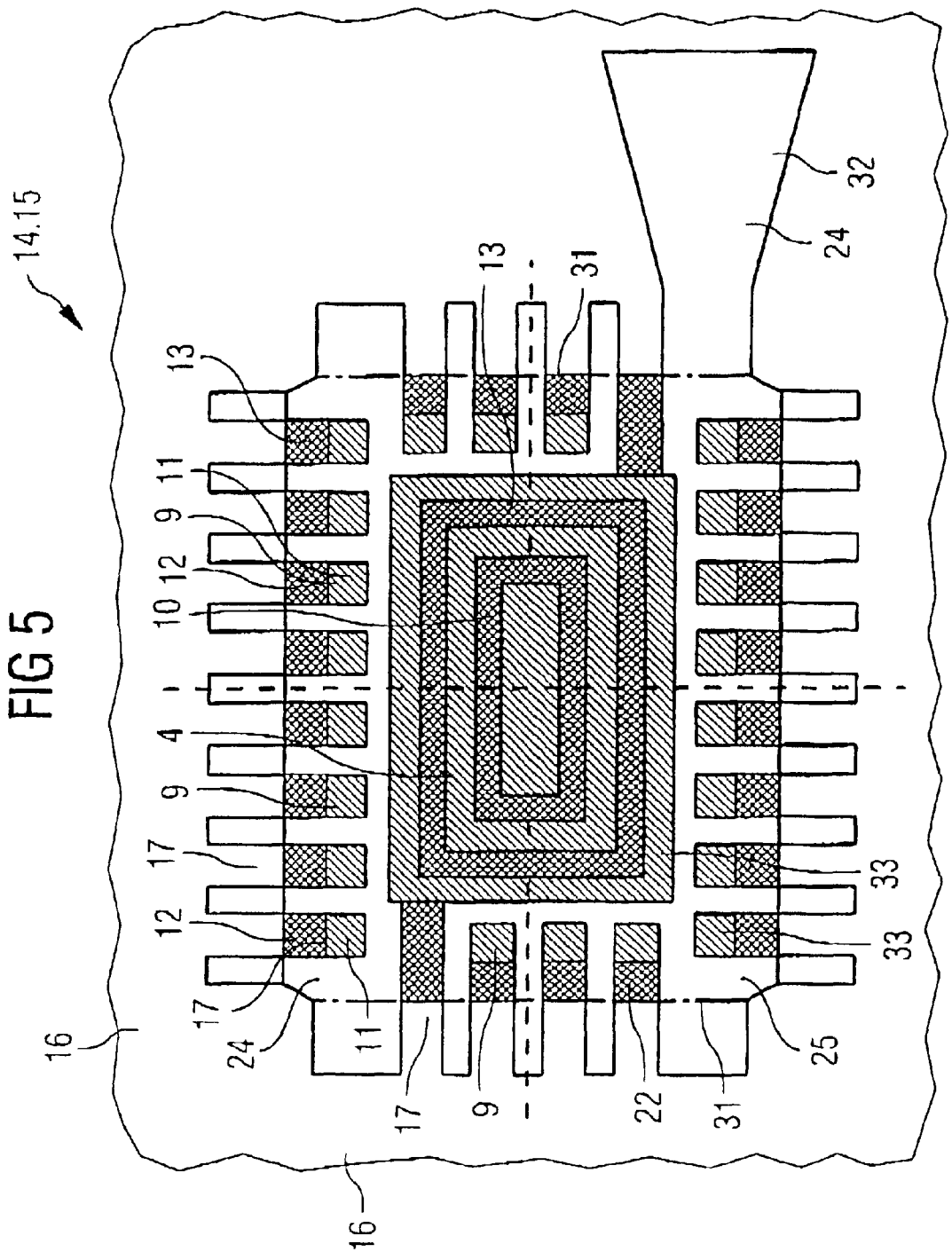
FIG. 5 is a plan view showing a coated device position of a leadframe according to a third embodiment of the invention.

FIG. 5 shows a diagrammatic plan view of a coated device position 15 of a leadframe 14 of a third embodiment of the invention. Components with functions identical to those in the previous figures are identified by identical reference symbols and not explained separately.

On the chip island 4 of the third embodiment of the invention, the contact layer regions 11 are marked in hatched fashion and the adhesion layer regions 12 are crosshatched. On the chip island 4, the contact layer regions 11 and the adhesion layer regions 12 are formed as rings, the outermost ring on the chip island 4 having a contact layer region 11 and the further rings alternately forming adhesion layer regions 12 and contact layer regions 11. The top sides of the inner flat conductor sections 9 likewise have, toward the chip island 4, contact layer regions 11 which can be connected to bonding wires 28. Equally, from the edge of the chip island 4, via the annular contact layer region 11 in the edge region of the chip island 4, the potential of the chip island 4 can be connected via bonding wires to contact areas on the semiconductor chip. The complete coating of the chip island 4 with alternating contact layer regions 11 and adhesion layer regions 12 prevents direct contact between a conductive adhesive and the metal of the chip island 4, so that migration of metallic conductive filling material of the adhesive in the direction of the chip island 4 cannot occur and, consequently, the adhesive is not depleted of conductive material either. Furthermore, the adhesive is reliably anchored with the chip island 4 by the annular adhesion layer regions 12.

After the structuring of a leadframe 14, firstly the contact layer regions 11 of the chip island 4 and the inner flat conductor sections 9 are provided with a metal alloy coating 33, which has silver or an alloy of silver in this exemplary embodiment. Afterward, the leadframe 14 is prepared for application of the adhesion layer regions 12 on the inner flat conductor sections 9 and the chip island 4. To that end, at least the outer flat conductor sections of the leadframe 14 on the underside (not shown) of the leadframe 14 are covered, so that only the surfaces of the inner flat conductor sections 9 and the chip island 4 can be coated with an adhesion layer.

For coating with an adhesion layer made of metal oxides, the leadframe 14 is dipped into an electrodeposition bath. In one embodiment of the invention, the electrodeposition bath has sodium hydroxide solution, sodium dichromate and zinc oxide, which are dissociated in water. During the electrodeposition of chromium oxide and zinc oxide for the adhesion layer regions 12, dendritic structures are produced on the surfaces of the inner flat conductor sections 9 and the chip island 4 or, in the case of a metal plating layer deposited in a closed manner beforehand, the dendrites are produced on the metal plating layer. Consequently, the contact layer regions 11 are likewise covered with an adhesion layer in the electrodeposition bath.

The electrodeposited adhesion layer made of metal oxides improves the anchoring of the chip island 4 in the conductive adhesive for fixing a semiconductor chip on the chip island 4 and, on the inner flat conductor sections 9, it improves the anchoring of these flat conductor sections 9 in the plastics molding compound 24 of the plastic housing 25. In the case of closed deposition of the adhesion layer made of metal oxides in the device positions 15 of a leadframe 14, firstly the contact layer regions 11 are also covered by the adhesion layer. Therefore, the leadframe 14 is subsequently coated with a closed photolithography layer at least within the device positions 15. Afterward, the adhesion layer is uncovered selectively in the contact layer regions 11 in two steps.

Firstly, a scanned laser beam is used to uncover the photolithography layer above the contact layer regions 11. In this case, the dendrites of the adhesion layer are melted on at the same time, so that the adhesion layer is leveled above the contact layer regions 11. Afterward, the contact layer regions 11 are completely uncovered by dissolving the residual adhesion layer in a dilute acid. This process of dissolving the leveled adhesion layer regions 12 stops or is greatly slowed down as soon as the metallic surface of the contact layer regions 12 is reached, since noble metals such as silver or gold or alloys thereof are relatively acid-resistant. Finally, for the complete removal of the photolithography layer for the purpose of uncovering the adhesion layer regions 12, an alkaline solvent is used for the residual photolithography layer, which solvent does not attack the adhesion layer regions 12, especially as the latter include metal oxides, and are relatively alkali-resistant.

A leadframe 14 prepared and coated in this way, as it is shown by the following FIGS. 5 to 9, can be utilized commercially as a preliminary product for the production of electronic devices. A coating of all the components before the application of a plastics molding compound 24 of the plastic housing 25 can be obviated with use of a leadframe 14 prepared according to the invention. Consequently, the risk of embrittlement of the electrical connecting lines on account of reactions with an adhesion layer material and the risk of impairment of the passivation by deposition of an adhesion layer material on a semiconductor chip is completely eliminated with use of the leadframe 14 according to the invention for the production of electronic devices 1 and, at the same time, the migration of metallic filling materials from an adhesive below a semi-conductor chip is completely prevented.

Figure 6:
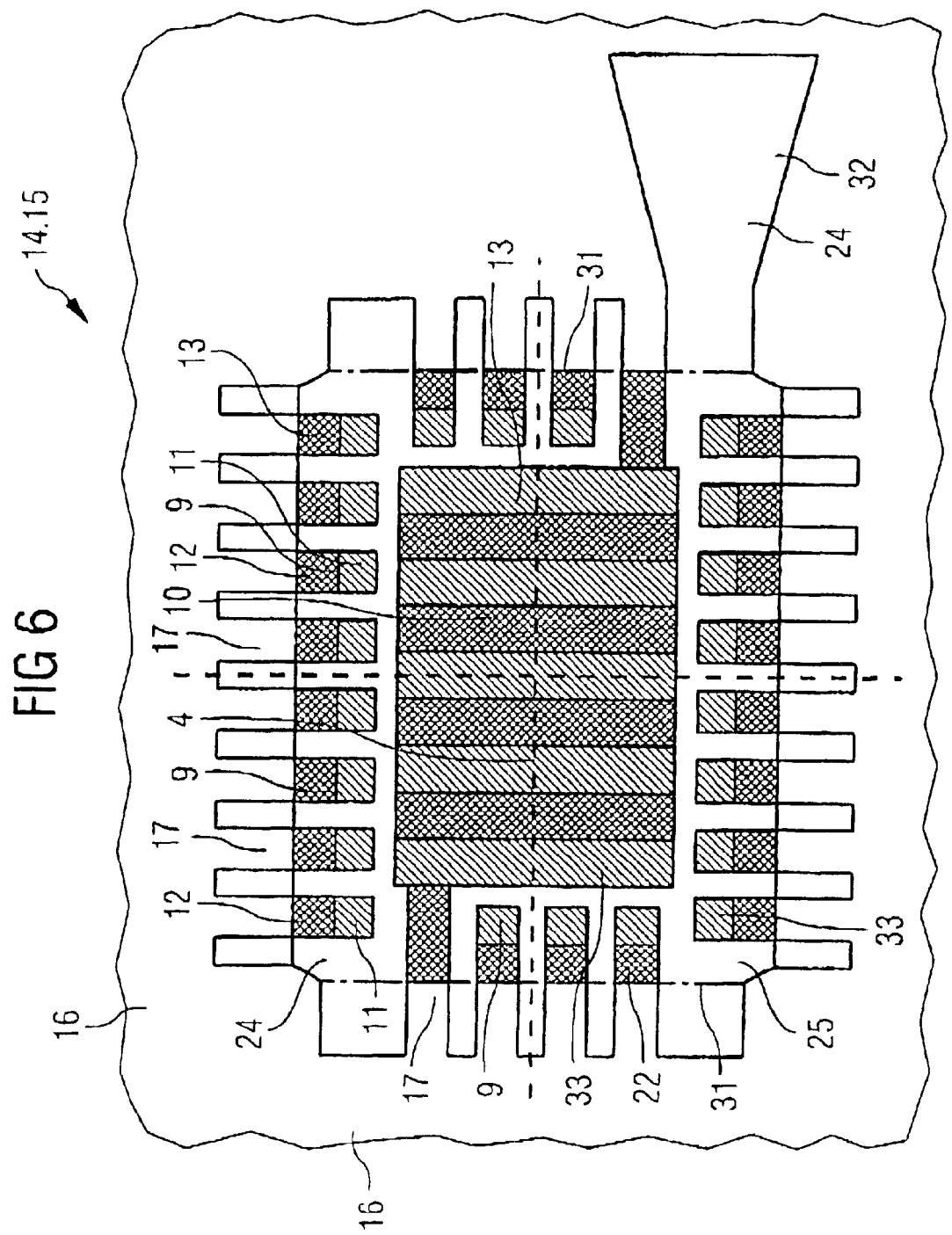
FIG. 6 is a plan view showing a coated device position of a leadframe according to a fourth embodiment of the invention.

FIG. 6 shows a diagrammatic plan view of a coated device position 15 of a leadframe 14 of a fourth embodiment of the invention. Components with functions identical to those in the previous figures are identified by identical reference symbols and not explained separately.

The fourth embodiment shown in FIG. 6 differs from the third embodiment shown in FIG. 5 by the fact that the contact layer regions 11 and the adhesion layer regions 12 are disposed in strips on the chip island 4. This structure of contact layer regions 11 and adhesion layer regions 12 also has the advantage that the entire chip island is covered with one layer, so that migration of the metallic filler from the conductive adhesive in the direction of the surface of the chip island 4 is prevented and that different sizes of a semi-conductor chip 2 can be disposed on the chip island 4.

Figure 7:
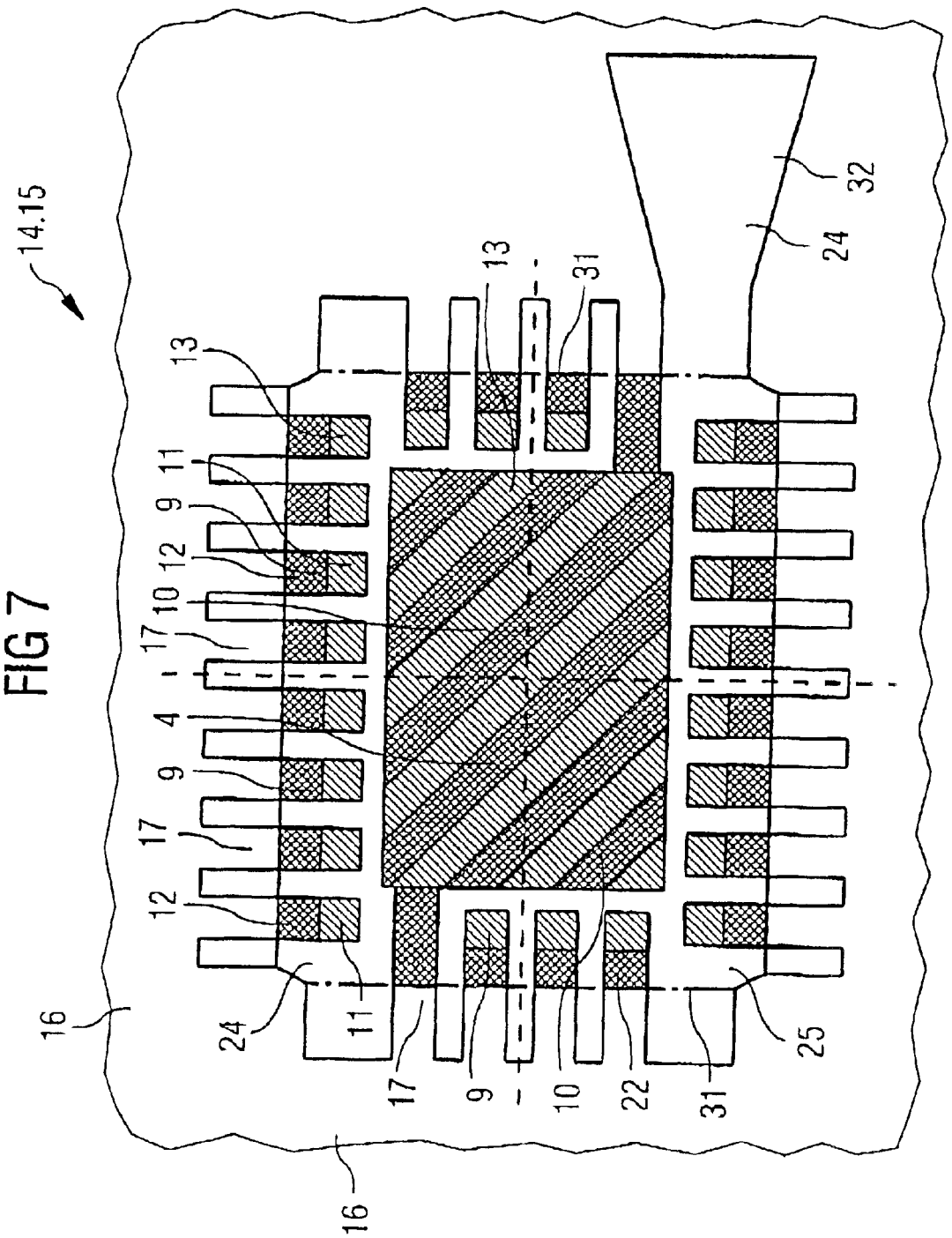
FIG. 7 is a plan view showing a coated device position of a leadframe according to a fifth embodiment of the invention.

FIG. 7 shows a diagrammatic plan view of a coated device position 15 of a leadframe 14 of a fifth embodiment of the invention. Components with functions identical to those in the previous figures are identified by identical reference symbols and not explained separately.

The fifth embodiment of the invention shown in FIG. 7 differs from the fourth embodiment of the invention shown in FIG. 6 by the fact that the strips of contact layer regions 11 and adhesion layer regions 12 are disposed at an angle to the side edges on the chip island 4. This pattern 10 of oblique strips also has the advantage that, on the one hand, the chip island 4 is fully covered with a coating and that, on the other hand, different chip sizes can be disposed on the chip island 4. In this case, the contact layer regions 11 have an electrometal plating made of aluminum, silver, gold, or alloys thereof and the adhesion layer regions 12 have a layer made of metal oxides 13. The angle between the side edge and the oblique position of the strips of contact layer regions 11 and adhesion layer regions 12 can be chosen as desired and is 45° in this embodiment of FIG. 7.

Figure 8:
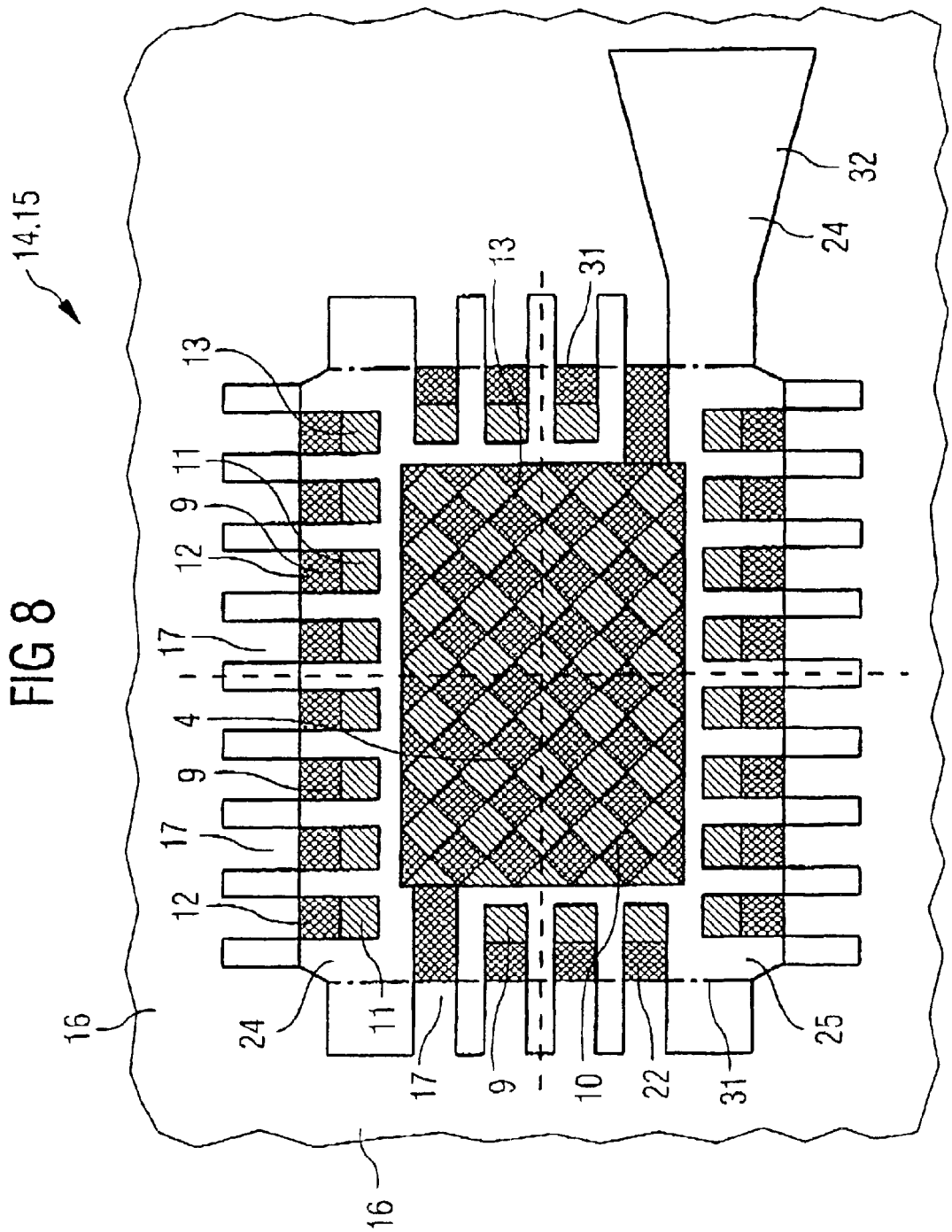
FIG. 8 is a plan view showing a coated device position of a leadframe according to a sixth embodiment of the invention.

FIG. 8 shows a diagrammatic plan view of a coated device position 15 of a leadframe 14 of a sixth embodiment of the invention. Components with functions identical to those in the previous figures are identified by identical reference symbols and not explained separately.

The sixth embodiment of the invention differs from the previous embodiments by the fact that the chip island 4 is covered with a rhomboid pattern 10 of contact layer regions 11 and adhesion layer regions 12. The effect of this rhomboid pattern 10 has the same advantages as in the embodiments that are shown in FIGS. 5 to 7.

FIG. 9 shows a diagrammatic plan view of a device position 15 of a leadframe 14 of a seventh embodiment of the invention. Components with functions identical to those in the previous figures are identified by identical reference symbols and not explained separately.

The seventh embodiment of the invention differs from the previous embodiments of the invention that are shown in FIGS. 5 to 8 by the fact that the pattern 10 of contact layer regions 11 and adhesion layer regions 12 is chessboard-like.

As in the previous embodiments, it covers the entire area of the chip island 4 and ensures that migration of the metal filler of the adhesive to the surface of the chip island 4 does not take place. Furthermore, this embodiment of the invention affords a number of bonding possibilities with the contact pads on the chip island 4, as a result of which the potential of the chip island 4 can be transmitted to the topside of the semiconductor chip 2.

I claim:

1. An electronic device comprising:
   a chip island having contact pads and a coplanar pattern;
   a semiconductor chip having a top side and a rear side, said rear side disposed on said chip island, and said top side having contact areas electrically connected to said contact pads of said chip island;
   said coplanar pattern including electrically conductive contact terminal regions alternating with insulating adhesion layer regions at least in a region of said chip island being covered by said semiconductor chip.

2. The electronic device according to claim 1, wherein said pattern is a chessboard pattern.

3. The electronic device according to claim 1, wherein said pattern is a strip pattern.

4. The electronic device according to claim 1, wherein said pattern is a rhomboid pattern.

5. The electronic device according to claim 1, wherein said contact terminal regions have an electrodeposited metal alloy plating and are not covered by the insulating adhesion layer.

6. The electronic device according to claim 5, wherein said metal alloy plating is selected from the group consisting of aluminum, silver, and gold.

7. The electronic device according to claim 1, wherein said adhesion layer regions have an electrodeposited metal oxide layer.

8. The electronic device according to claim 1, wherein said adhesion layer regions have from 50 to 90 mol % zinc and from 10 to 50 mol % chromium.

9. An electronic device comprising:
   a chip island having contact pads and a coplanar pattern;
   an inner flat conductor section having a contact pad;
   a semiconductor chip having a top side and a rear side, said rear side disposed on said chip island, and said top side having contact areas electrically connected to said contact pad contact pads;
   said coplanar pattern including electrically conductive contact terminal regions alternating with insulating adhesion layer regions at least in a region of said chip island being covered by said semiconductor chip.

10. The electronic device according to claim 9, wherein said pattern is a chessboard pattern.

11. The electronic device according to claim 9, wherein said pattern is a strip pattern.

12. The electronic device according to claim 9, wherein said pattern is a rhomboid pattern.

13. The electronic device according to claim 9, wherein said contact terminal regions have an electrodeposited metal alloy plating and are not covered by the insulating adhesion layer.

14. The electronic device according to claim 13, wherein said metal alloy plating is selected from the group consisting of aluminum, silver, and gold.

15. The electronic device according to claim 9, wherein said adhesion layer regions have an electrodeposited metal oxide layer.

16. The electronic device according to claim 9, wherein said adhesion layer regions have from 50 to 90 mol % zinc and from 10 to 50 mol % chromium.

17. A leadframe comprising:
   a chip island for a semiconductor chip and having a coplanar pattern of adhesion layer regions alternating with contact layer regions;
   inner flat conductor sections;
   a plurality of device positions for electronic devices and configured in one of a matrix form and an inline form, each of said device positions having a leadframe frame;
   a respective web for each of said device positions held by said leadframe frame and extending from said leadframe frame toward said chip island; and
   a further respective web for each of said device positions extending from said leadframe frame to said inner flat conductor sections.

18. The leadframe according to claim 17, wherein said pattern is configured in a chessboard-like manner for each of said device positions.

19. The leadframe according to claim 17, wherein said pattern has a strip pattern for each of said device positions.

20. The leadframe according to claim 17, wherein said pattern has a rhomboid pattern for each of said device positions on the leadframe.

21. The leadframe according to claim 17, wherein said contact layer regions have an electrodeposited metal alloy plating not covered by said insulating adhesion layer.

22. The leadframe according to claim 21, wherein said metal alloy plating contains metals selected from the group consisting of aluminum, silver, and gold.

23. The leadframe according to claim 17, wherein said adhesion layer regions have an electro-deposited metal oxide layer.

24. The leadframe according to claim 17, wherein said leadframe frame has a perforation formed therein for positioning said leadframe in a placement machine.

25. The leadframe according to claim 17, wherein said contact layer regions have an electrodeposited metal alloy plating.

26. The leadframe according to claim 25, wherein said eletrodeposited metal alloy is selected from the group consisting of aluminum, silver, gold, and alloys thereof.

27. The leadframe according to claim 17, wherein said adhesion layer regions contain metal oxides.

28. The leadframe according to claim 17, wherein said adhesion layer regions contain from 50 to 90 mol % zinc and from 10 to 50 mol % chromium.

29. The leadframe according to claim 17, wherein said adhesion layer regions have a rough surface.

30. The leadframe according to claim 17, wherein said adhesion layer regions have dendrites.

31. The leadframe according to claim 17, wherein said adhesion layer regions are alkali-resistant.

32. The leadframe according to claim 17, wherein said adhesion layer regions are acid-soluble.

33. The leadframe according to claim 17, wherein said leadframe contains at least one of ultrapure copper and a copper alloy.

34. The leadframe according to claim 17, wherein said leadframe has a copper-coated plastic tape.

35. A preliminary product for production of an electronic device, the product comprising:
   a leadframe including:
     a chip island for a semiconductor chip and having a coplanar pattern of adhesion layer regions alternating with contact layer regions;
     inner flat conductor sections;
     a plurality of device positions for electronic devices and configured in one of a matrix form and an inline form, each of said device positions having a leadframe frame;
a respective web for each of said device positions held by said leadframe frame and extending from said leadframe frame toward said chip island; and
a further respective web for each of said device positions extending from said leadframe frame to said inner flat conductor sections.

* * * * *